(12) United States Patent
Imam et al.

(10) Patent No.: US 12,382,645 B2
(45) Date of Patent: Aug. 5, 2025

(54) SEMICONDUCTOR DEVICE

(71) Applicant: Vanguard International Semiconductor Corporation, Hsinchu (TW)

(72) Inventors: Syed-Sarwar Imam, Bihar (IN); Chia-Hao Lee, Hsinchu County (TW); Hung-Wei Wang, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 414 days.

(21) Appl. No.: 18/070,482

(22) Filed: Nov. 29, 2022

(65) Prior Publication Data

US 2024/0178327 A1    May 30, 2024

(51) Int. Cl.
*H10D 8/60* (2025.01)
*H10D 62/10* (2025.01)

(52) U.S. Cl.
CPC ............ *H10D 8/60* (2025.01); *H10D 62/106* (2025.01); *H10D 62/126* (2025.01)

(58) Field of Classification Search
CPC ........... H10D 8/60; H10D 62/106–107; H10D 62/126; H10D 64/117
See application file for complete search history.

(56) References Cited

U.S. PATENT DOCUMENTS

| 9,318,624 | B2 * | 4/2016 | Zhang | H10D 62/124 |
| 11,195,922 | B2 | 12/2021 | Yen | |
| 2002/0125541 | A1 | 9/2002 | Korec | |
| 2010/0289075 | A1 | 11/2010 | Lin | |
| 2021/0036165 | A1 | 2/2021 | Yu | |
| 2021/0167225 | A1 | 6/2021 | Arima | |
| 2021/0296512 | A1 * | 9/2021 | Song | H10D 62/117 |

FOREIGN PATENT DOCUMENTS

TW    202147626 A    12/2021

* cited by examiner

*Primary Examiner* — Daniel Luke
(74) *Attorney, Agent, or Firm* — Winston Hsu (57) ABSTRACT

A semiconductor device, which comprises a semiconductor substrate, an epitaxial layer, first metal structures, first doped regions, second metal structures, second doped regions, a conductive layer and a Schottky layer. The epitaxial layer is disposed on the semiconductor substrate. The first metal structures are disposed in the epitaxial layer. The first metal structures extend along a first direction and have a first width in a second direction. The first doped regions are disposed in the epitaxial layer and extend from below each first metal structure to the sidewall of each first metal structure. The second metal structure is disposed in the epitaxial layer. The second metal structures extend along the first direction and have a second width in the second direction, wherein the first width is larger than the second width. The conductive layer is disposed under the semiconductor substrate, and the Schottky layer is disposed on the epitaxial layer.

20 Claims, 10 Drawing Sheets

SEMICONDUCTOR DEVICE

BACKGROUND OF THE INVENTION

1. Field of the Invention

The present invention relates to a semiconductor device, and in particular to a semiconductor device with a Schottky diode element.

2. Description of the Prior Art

A Schottky diode element is a diode consisted of a metal-semiconductor junction. Because the starting voltage of the Schottky diode is lower than the starting voltage of a PN diode element and reaction speed of the Schottky diode is faster, it is widely used in a power converter. However, the conventional Schottky diode element also has disadvantages. For example, serious leakage current happens when the element is reversely biased, or the Schottky diode element can't bear the surge current generated at the startup moment of the device. Therefore, how to improve the conventional Schottky diode element to meet the practical requirements is still a topic faced by present industry.

SUMMARY OF THE INVENTION

One of the objects in the present invention is to overcome the shortcomings of the aforementioned Schottky diode device and to solve the problems in the prior art.

To achieve the above object, the present invention provides a semiconductor device including a semiconductor substrate, an epitaxial layer, a plurality of first metal structures, a plurality of first doped regions, a plurality of second metal structures, a plurality of second doped regions, a conductive layer and a Schottky layer. The epitaxial layer is disposed on the semiconductor substrate and is of a first conductivity type. The first metal structures are disposed in the epitaxial layer, extend parallelly to each other along a first direction, and have a first width in a second direction. The first doped regions are disposed in the epitaxial layer and are of a second conductivity type different from the first conductivity type, and each of the first doped regions extends from below each of the first metal structures to a sidewall of each of the first metal structures. The second metal structures are disposed in the epitaxial layer, extend parallelly to each other along the first direction, and have a second width in the second direction, wherein the first width is greater than the second width. The second doped regions are disposed in the epitaxial layer and are of the second conductivity type, and each of the second doped regions extend from below each of the second metal structures to a sidewall of each of the second metal structures. The conductive layer is disposed under the semiconductor substrate. The Schottky layer is disposed on the epitaxial layer. Wherein the first metal structure is between two adjacent second metal structures, and the second metal structure is between two adjacent first metal structures.

The semiconductor device of the present invention may effectively reduce the generation of surge current during operation of a forward bias. During reverse bias operation, the breakdown voltage (BVD) may be increased, thus enhancing the reliability thereof as a Schottky diode element.

These and other objectives of the present invention will no doubt become obvious to those of ordinary skill in the art after reading the following detailed description of the preferred embodiment that is illustrated in the various figures and drawings.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "under," "lower," "over," "above," "on," "upper" and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

Figure 1:
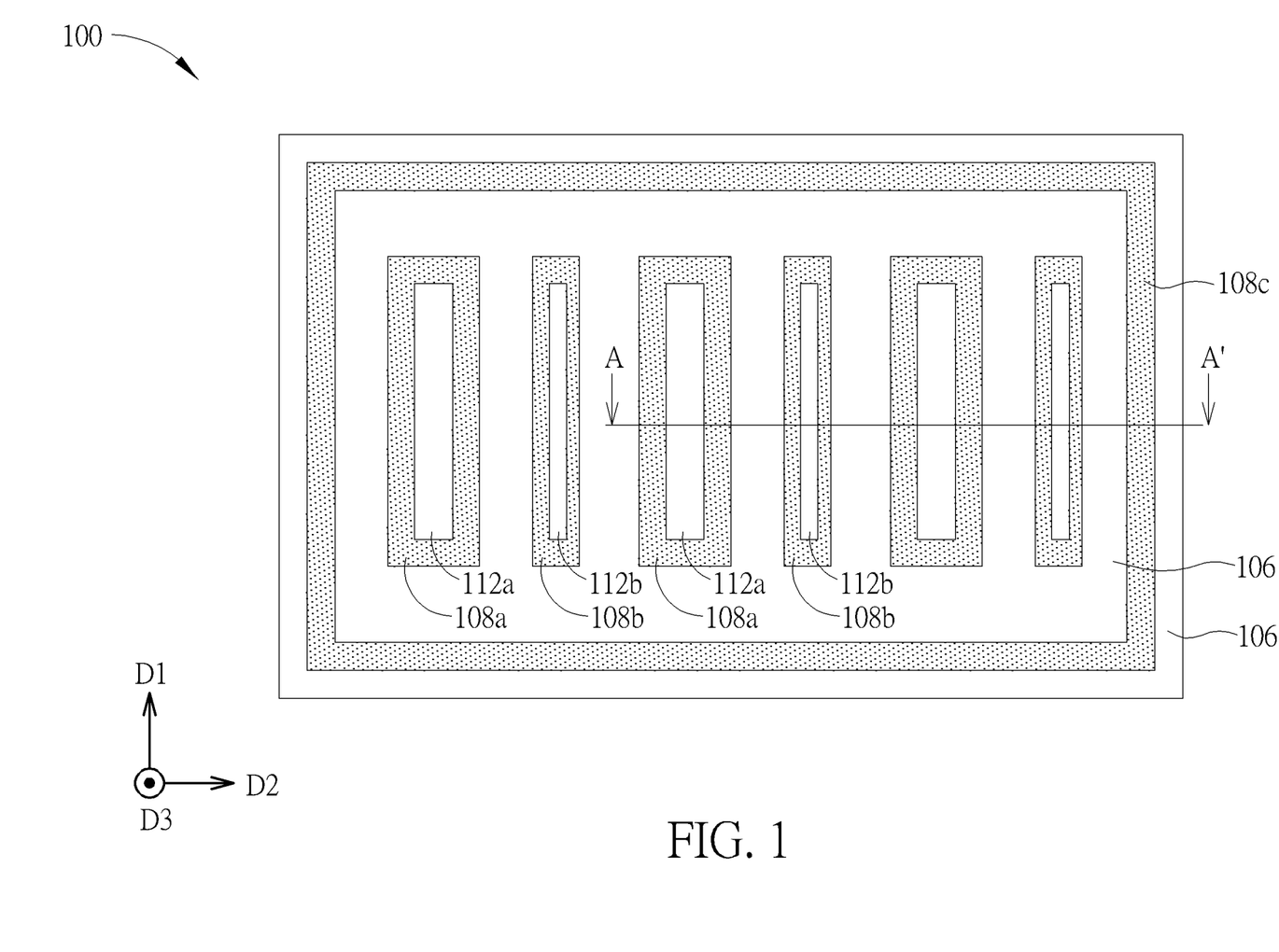
FIG. 1 is a schematic diagram illustrating a plan view of a semiconductor device according to an embodiment of the present invention.
Figure 2:
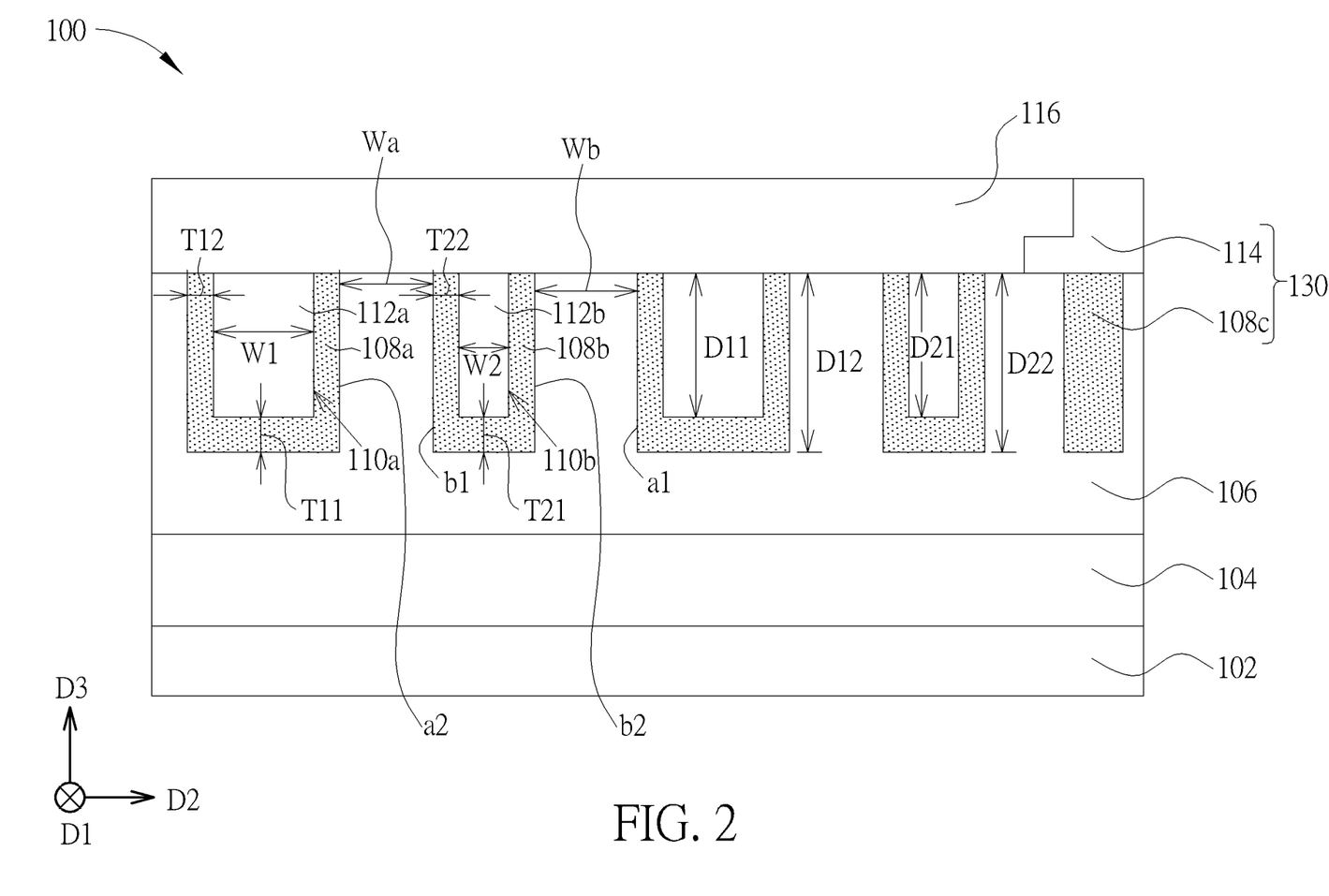
FIG. 2 is a schematic diagram illustrating a cross-sectional view along line A-A' in FIG. 1.

Referring to FIG. 1 and FIG. 2, which are schematic diagrams of a semiconductor device 100 of one embodiment of the present invention, where FIG. 1 is a schematic plan view of the semiconductor device 100 and FIG. 2 is a schematic cross-sectional view of the semiconductor device 100. First, as shown in FIG. 1 and FIG. 2, the semiconductor device 100 includes a semiconductor substrate 104, such as a semiconductor substrate with a first conductivity type (e.g., N type), but not limited thereto. In this embodiment, the semiconductor substrate 104 is a silicon substrate or a compound semiconductor substrate, such as a silicon carbide substrate, but not limited thereto. An epitaxial layer 106 is disposed on the semiconductor substrate 104, and the epitaxial layer 106 may comprise a compound semiconductor, such as a III-V compound semiconductor, or other voltage-resistant semiconductor substrates, such as silicon carbide. Both the semiconductor substrate 104 and the epitaxial layer 106 are of the first conductivity type (e.g., N type), and the doping concentration of the epitaxial layer 106 is lower than the doping concentration of the semiconductor substrate 104. In one embodiment, the doping concentration of the epitaxial layer 106 is about 1E15 to 1E16 ions/cm$^3$, and the doping concentration of the semiconductor substrate 104 is about 1E18 to 1E22 ions/cm$^3$. However, in another embodiment, the material of the semiconductor substrate 104 is not limited to the foregoing, and may also include a single-layer or composite-layer semiconductor substrate made of other suitable semiconductor materials. In addition, in one embodiment, the thickness of the epitaxial layer 106 may also be adjusted according to the voltage-resistant requirements of the semiconductor device 100. For example, the thicker the epitaxial layer 106 is, the better the voltage-resistant it may exhibit, so as to improve the voltage-resistant ability of the subsequently formed Schottky diode element.

A dielectric layer 114 and a Schottky layer 116 are disposed on the epitaxial layer 106, and a conductive layer 102 is disposed under the semiconductor substrate 104 to form the Schottky diode element of the present invention.

The Schottky layer 116 directly contacts the underlying epitaxial layer 106, such that a Schottky junction may be formed between the Schottky layer 116 and the epitaxial layer 106. The Schottky layer 116 may include a metal, such as titanium, nickel, platinum, aluminum or a combination thereof, or a metal silicide, such as titanium silicide ($TiSi_2$), nickel silicide ($Ni_2Si$), etc., but not limited thereto. In another embodiment, the Schottky layer 116 may be a single conductive layer or a composite conductive layer according to the actual product requirements. The conductive layer 102 may comprise titanium, nickel, aluminum or other metals, but not limited thereto. Therefore, the epitaxial layer 106 and the Schottky layer 116 may form a Schottky contact, such that the Schottky layer 116 serves as an anode of the Schottky diode element.

The dielectric layer 114 may surround the periphery of the Schottky layer 116 to define an electrical connection area between the Schottky layer 116 and the epitaxial layer 106.

The conductive layer 102 is disposed on the back side of the semiconductor substrate 104 and electrically connected to the semiconductor substrate 104. An ohmic contact is formed between the conductive layer 102 and the semiconductor substrate 104, such that the conductive layer 102 may be used as a cathode of the Schottky diode element.

In addition, a protective structure 130 may be disposed around the periphery of the Schottky diode element to prevent the electrical interference between the Schottky diode element and adjacent elements. In this embodiment, the protective structure 130 is consisted of a third doped region 108c and a dielectric layer 114. The third doped region 108c is disposed in the epitaxial layer 106 and surrounds a portion of the epitaxial layer 106, such as a current conductive region of the Schottky diode element. The third doped region 108c is of a second conductivity type (e.g., P-type), which is different from the first conductivity type. According to actual requirements, the doping concentration of the third doped region 108c may be greater than the doping concentration of the epitaxial layer 106, the dielectric layer 114 is disposed on the third doped region 108c, and the dielectric layer 114 contacts the third doped region 108c.

In addition, the Schottky diode element also includes a plurality of first doped regions 108a and a plurality of second doped regions 108b formed in the epitaxial layer 106 and located below the Schottky layer 116, and the first doped regions 108a and the second doped regions 108b are surrounded by the protective structure 130. In one embodiment, the doping concentration of the first doped region 108a and the doping concentration of the second doped region 108b are about 1E15 to 1E16 ions/cm$^3$. In another embodiment, the doping concentration of the first doped region 108a and the doping concentration of the second doped region 108b may be greater than the doping concentration of the epitaxial layer 106.

The Schottky diode element also includes a plurality of first trenches 110a respectively formed in the first doped regions 108a and a plurality of second trenches 110b respectively formed in the second doped regions 108b.

The first trenches 110a may be filled with metal to form a plurality of first metal structures 112a, and the second trenches 110b may be filled with metal to form a plurality of second metal structures 112b. The metal may be titanium, nickel, platinum, aluminum or a combination of the above, but not limited thereto. The metal included in the first metal structure 112a, the metal included in the second metal structure 112b and the material included in the Schottky layer 116 may be the same or different. Each of the first metal structures 112a and each of the second metal structures 112b may form a Schottky contact with the abutting first doped region 108a and the second doped region 108b.

In the plan view shown in FIG. 1, the first metal structures 112a extend along a first direction D1, and are parallel to each other and arranged in a second direction D2. Each of the first metal structures 112a has a first width W1 in the second direction D2, and the first width W1 may be 1 μm to 5 μm or 1.6 μm to 3 μm. The second metal structures 112b extend along the first direction D1, and are parallel to each other and arranged in the second direction D2. Each of the second metal structures 112b has a second width W1 in the second direction D2, and the second width W2 may be 0.1 μm to 2 μm or 0.4 μm to 1 μm, where the first width W1 is greater than the second width W2. In this embodiment, the first metal structures 112a and the second metal structures 112b are alternately disposed in the second direction D2. In other words, there is a second metal structure 112b between two adjacent first metal structures 112a and a first metal structure 112a between two adjacent second metal structures 112b. In addition, the first metal structure 112a and the second metal structure 112b adjacent to each other are separated by the epitaxial layer 106.

In the cross-sectional view shown in FIG. 2, the first doped regions 108a are of the second conductivity type (e.g., P-type), and each of the first doped regions 108a extends from below each of the first metal structures 112a to a sidewall of each of the first metal structures 112a. The second doped regions 108b are of the second conductivity type (e.g., P-type), each of the second doped regions 108b extends from below each of the second metal structures to a sidewall of each of the second metal structures 112b. Each of the first doped regions 108a includes a first sidewall a1 and a second sidewall a2 which are oppositely disposed to each other, each of the second doped regions 112b includes a first sidewall b1 and a second sidewall b2 which are oppositely disposed to each other, and each of the first doped region 108a has a first sidewall thickness T12, that is, the first sidewall a1 and the second sidewall a2 of each first doped region 108a have the same thickness (as known as the first sidewall thickness T12). The first sidewall thickness T12 may be 0.1 μm to 0.5 μm or 0.2 μm to 0.4 μm, and each of the second doped regions 108b has a second sidewall thickness T22, that is, the first sidewall b1 and the second sidewall b2 of each second doped region 108b have the same thickness (as known as the second sidewall thickness T22). The second sidewall thickness T22 may be 0.05 μm to 0.5 μm or 0.1 μm to 0.3 μm. In this embodiment, the first sidewall thickness T12 of the first doped region 108a is equal to the second sidewall thickness T22 of the second doped region 108b.

In the cross-sectional view shown in FIG. 2, the first metal structures 112a have a depth D11 in a third direction D3, the second metal structures 112b have a depth D21 in the third direction D3, and the third direction D3 is perpendicular to the first direction D1 and the second direction D2. In this embodiment, the depth D11 of the first metal structure 112a is equal to the depth D21 of the second metal structure 112b. The first doped regions 108a have a depth D12 in the third direction D3, and the second doped regions 108b have a depth D22 in the third direction D3. In this embodiment, the depth D12 of the first doped region 108a is equal to the depth D22 of the second doped region 108b. The first bottom thickness T11 of the first doped region 108a may be defined by the difference between the depth D12 of the first doped region 108a and the depth D11 of the first metal structure 112a. Similarly, the second bottom thickness T21 of the second doped region 108b may be defined by the difference between the depth D22 of the second doped region 108b and the depth D21 of the second metal structure 112b. In this embodiment, the first sidewall thickness T12 of the first doped region 108a, the first bottom thickness T11, the second sidewall thickness T22 of the second doped region 108b, and the second bottom thickness T21 are the same. In another embodiment, the first sidewall thickness T12 of the first doped region 108a, the first bottom thickness T11, the second sidewall thickness T22 of the second doped region 108b, and the second bottom thickness T21 are different from each other.

In the cross-sectional view shown in FIG. 2, the first doped region 108a has the first sidewall a1 and the second sidewall a2 which are oppositely disposed to each other, the second doped region 108b has the first sidewall b1 and the second sidewall b2 which are oppositely disposed to each other, the first sidewall a1 of the first doped region 108a faces the second sidewall b2 of the adjacent second doped region 108b, and the second sidewall a2 of the first doped region 108a faces the first sidewall b1 of the adjacent second doped region 108b. There is a first spacing Wa between the second sidewall a2 of the first doped region 108a and the first sidewall b1 of the second doped region 108b, and there is a second spacing Wb between the first sidewall a1 of the first doped region 108a and the second sidewall b2 of the second doped region 108b. The first spacing Wa and the second spacing Wb may be 1 μm to 5 μm. In this embodiment, the first spacing Wa is the same as the second spacing Wb, and the first spacing Wa and the second spacing Wb are equal to the first width W1 of the first metal structure 112a and greater than the second width W2 of the second metal structure 112b. In another embodiment, both the first spacing Wa and the second spacing Wb are less than the first width W1 of the first metal structure 112a, and both the first spacing Wa and the second spacing Wb are greater than the second width W2 of the second metal structure 112b, so as to adjust the electrical performance of the element, such as on current or breakdown voltage.

In this embodiment, the first doped region 108a and the second doped region 108b have the same doping concentration. In another embodiment, the first doped region 108a and the second doped region 108b have different doping concentrations. According to the actual requirements, the doping concentration of the third doped region 108c is greater than the doping concentration of the first doped region 108a and the doping concentration of the second doped region 108b.

According to actual requirements, the work functions of the first metal structure 112a, the second metal structure 112b and the Schottky layer 116 may be the same or different. In one embodiment, the work function of the first metal structure 112a and the work function of the second metal structure 112b are the same, and the work function of the Schottky layer 116 is different from the work function of the first metal structure 112a and the second metal structure 112b. By adjusting the work functions of the first metal structure 112a, the second metal structure 112b and the Schottky layer 116, the electrical control ability between the first metal structure 112a, the second metal structure 112b, the Schottky layer 116 and the adjacent epitaxial layer 106, such as the ability to turn off current or the ability to sustain surge current, may be adjusted, and thus the electrical performance of the semiconductor device may be increased.

Figure 3:
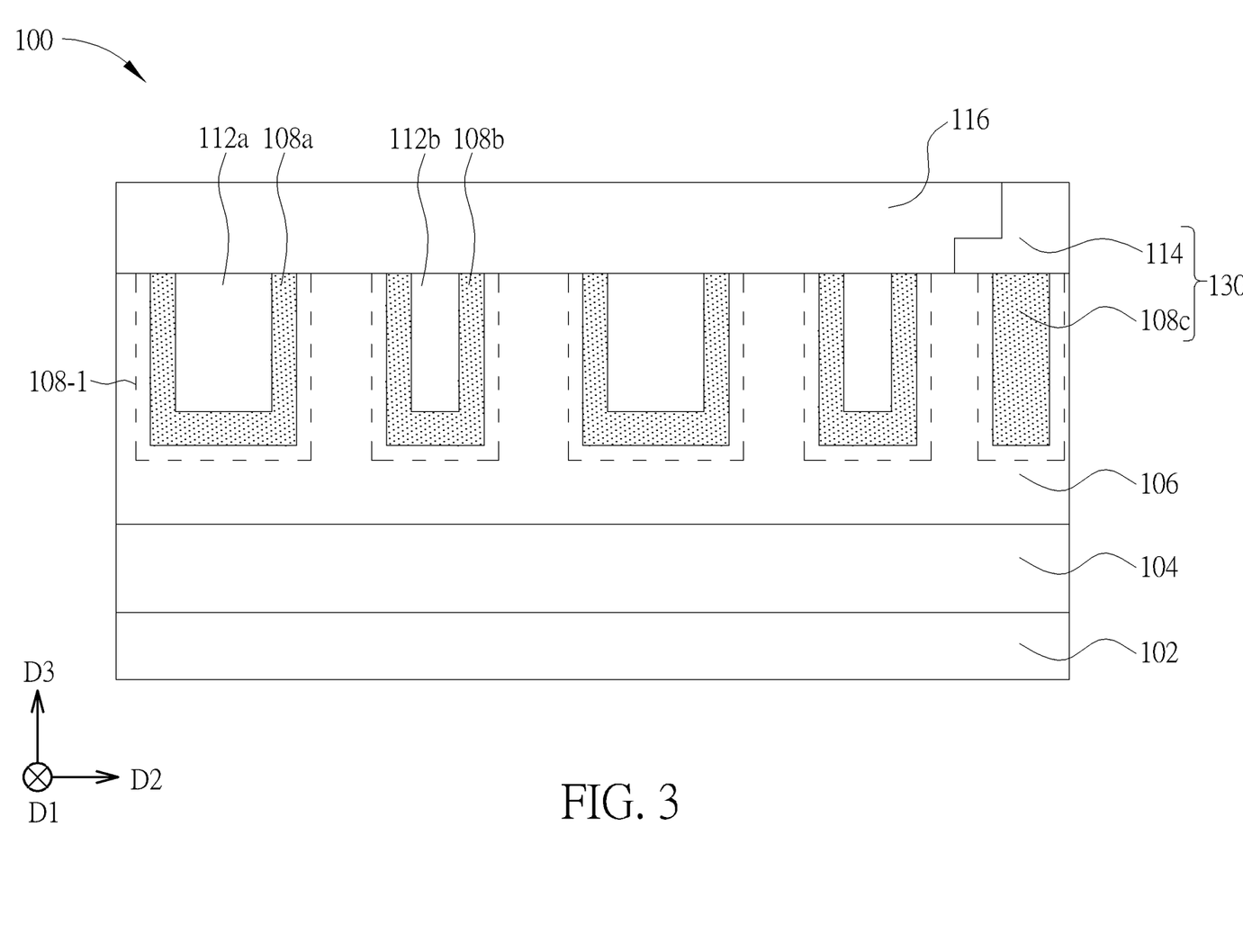
FIG. 3 is a schematic diagram illustrating a cross-sectional view of a semiconductor device according to another embodiment during reverse bias operation.

When a reverse bias is applied to the semiconductor device 100 shown in FIG. 2, the location of the depletion region formed due to the reverse bias may be exemplified as shown in FIG. 3. In FIG. 3, which illustrates a cross-sectional view of the Schottky diode element during reverse bias operation, when the Schottky diode element is subjected to a reverse bias, the depletion regions 108-1 between the first doped regions 108a, the second doped regions 108b and the epitaxial layer 106 expand in the first direction D1 and the second direction D2 at the same time. According to the actual requirements, the depletion regions 108-1 may contact each other or overlap each other by adjusting the first spacing Wa and the second spacing Wb in FIG. 2, so as to achieve a higher reverse breakdown voltage and lower reverse leakage current. For example, in one embodiment, the first spacing Wa and the second spacing Wb are both less than the first width W1 of the first metal structure 112a, such that the depletion regions 108-1 contact each other and overlap each other, so as to achieve a higher reverse breakdown voltage.

Figure 4:
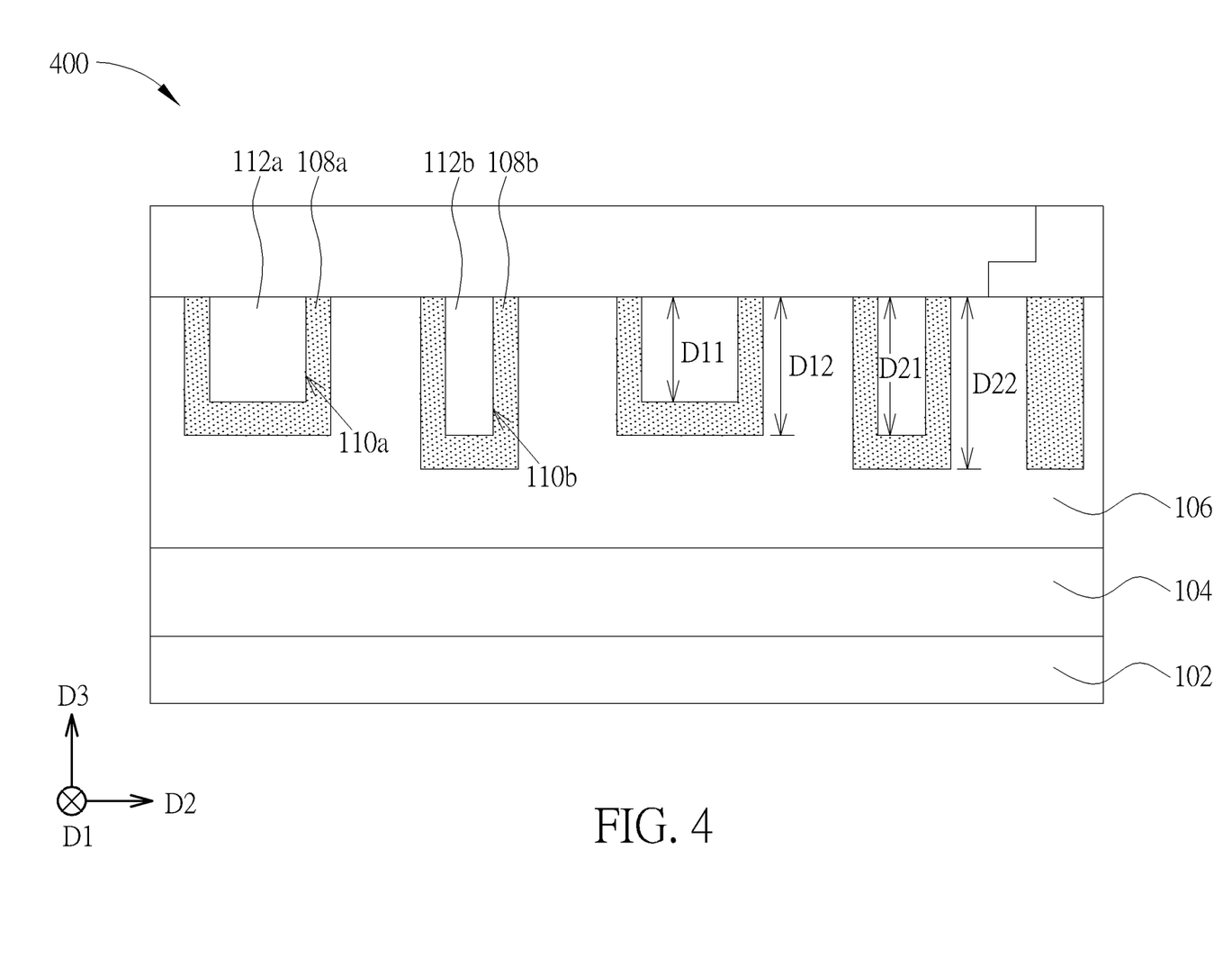
FIG. 4 is a schematic diagram illustrating a cross-sectional view of a semiconductor device according to another embodiment.
Figure 5:
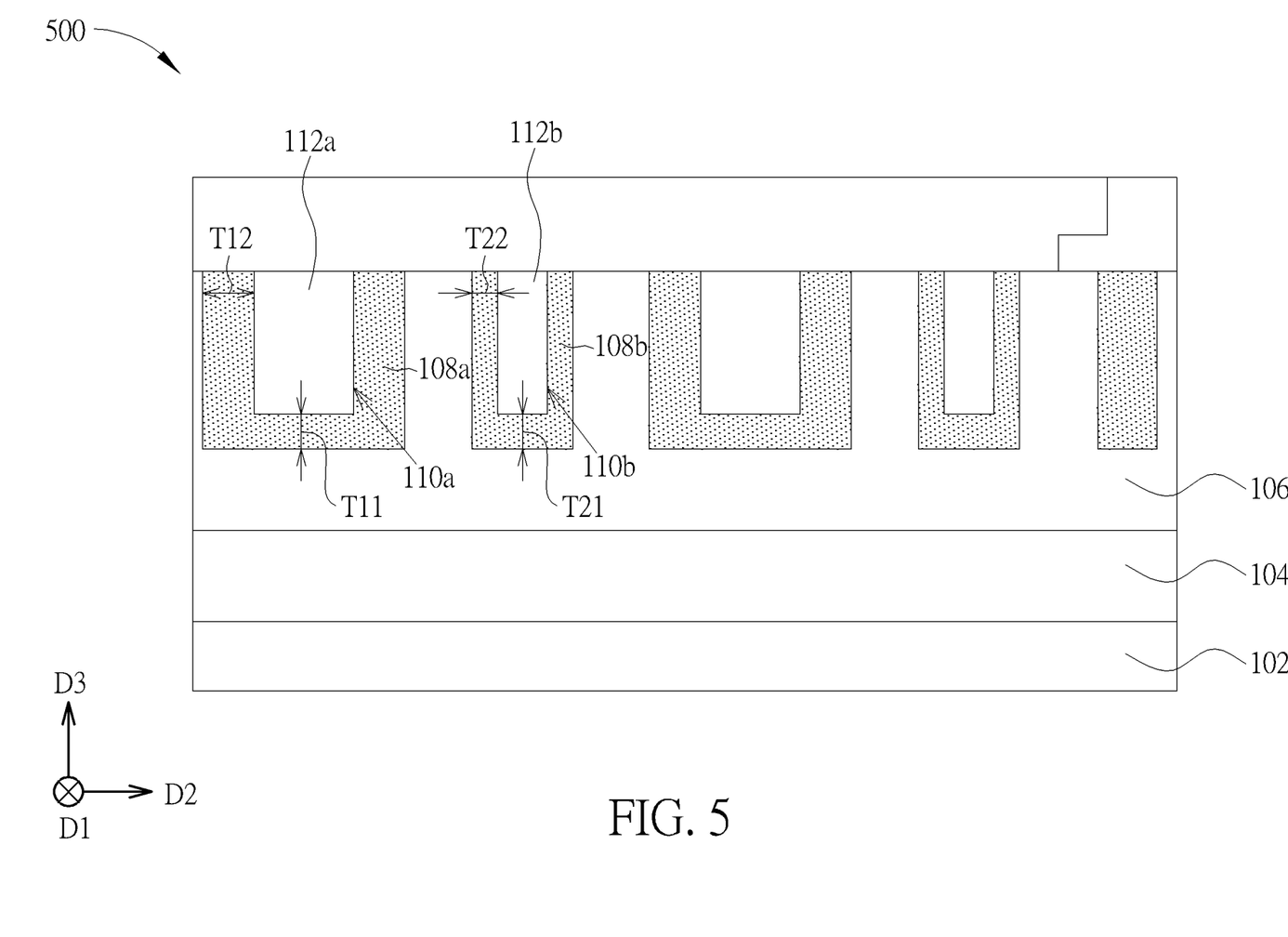
FIG. 5 is a schematic diagram illustrating a cross-sectional view of a semiconductor device according to another embodiment.

In addition to the abovementioned semiconductor device 100, the present invention also includes other embodiments of semiconductor devices, such as those shown in FIG. 4 and FIG. 5.

In the semiconductor device 400 shown in FIG. 4, a plurality of first metal structures 112a have a depth D11 in the third direction D3, a plurality of second metal structures 112b have a depth D21 in the third direction D3, the third direction D3 is perpendicular to the first direction D1 and the second direction D2, and the depth D11 of the first metal structure 112a is less than the depth D21 of the second metal structure 112b. The first doped regions 108a have a depth D12 in the third direction D3, the second doped regions 108b have a depth D22 in the third direction D3, and the depth D12 of the first doped region 108a is less than the depth D22 of the second doped region 108b.

In the semiconductor device 500 shown in FIG. 5, the first sidewall thickness T12 of the first doped region 108a is greater than the second sidewall thickness T22 of the second doped region 108b. In this arrangement, when the Schottky diode element is subjected to a reverse bias, the depletion regions (not shown) expanding in the second direction D2 corresponding to the first doped regions 108a are greater than the depletion regions (not shown) expanding in the second direction D2 corresponding to the second doped regions 108b. Preferably, the depletion regions of the first doped regions 108a expanding in the second direction D2 may overlap the depletion regions of the second doped regions 108b expanding in the second direction D2, so as to achieve a higher reverse breakdown voltage.

Figure 6:
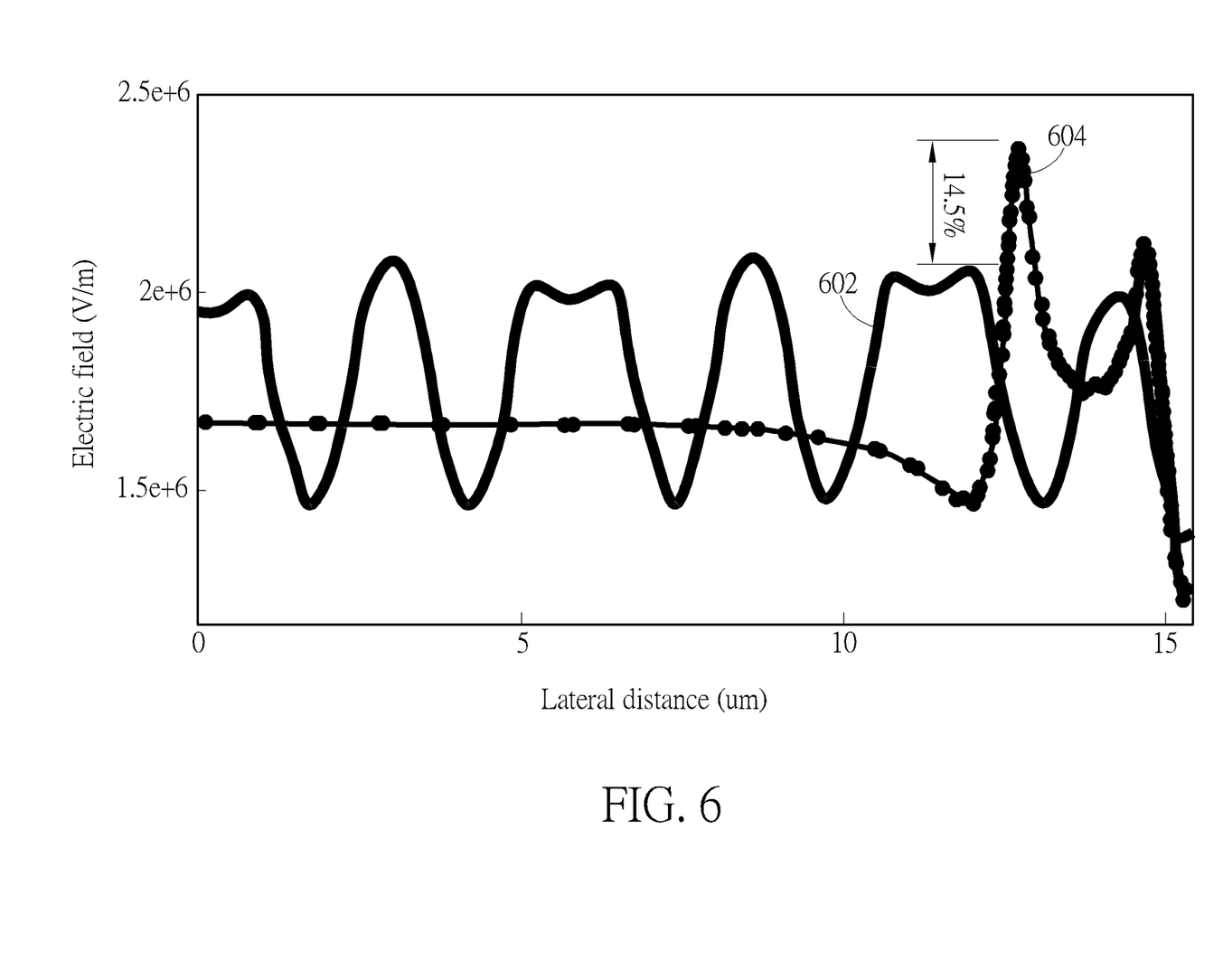
FIG. 6 is a diagram of electric field distribution of a semiconductor device during reverse bias operation according to an embodiment of the present invention.

In the diagram of electric field distribution shown in FIG. 6, the Schottky diode elements of the first embodiment and a comparative embodiment are used as test objects, respectively. The Schottky diode element of the comparative embodiment does not have any metal structure and doped region in the epitaxial layer. Referring to FIG. 6, curve 602 is the electric field distribution of the embodiment illustrated in FIG. 1 and FIG. 2, which is obtained by measuring along the bottoms of the first doped regions and the bottoms of the second doped regions of the first embodiment in the second direction, and curve 604 is the electric field distribution of the conventional Schottky diode element, which is obtained by measuring along a horizontal line of the epitaxial layer of the Schottky diode element. Curve 602 shows that the first embodiment has a gentle electric field distribution under reverse bias, and the electric field peak of curve 602 is about 14.5% lower than the electric field peak of curve 604. FIG. 6 shows that the present invention can effectively reduce the leakage current and increase the reverse breakdown voltage compared with the Schottky diode element of the comparative embodiment during reverse bias operation.

Figure 7:
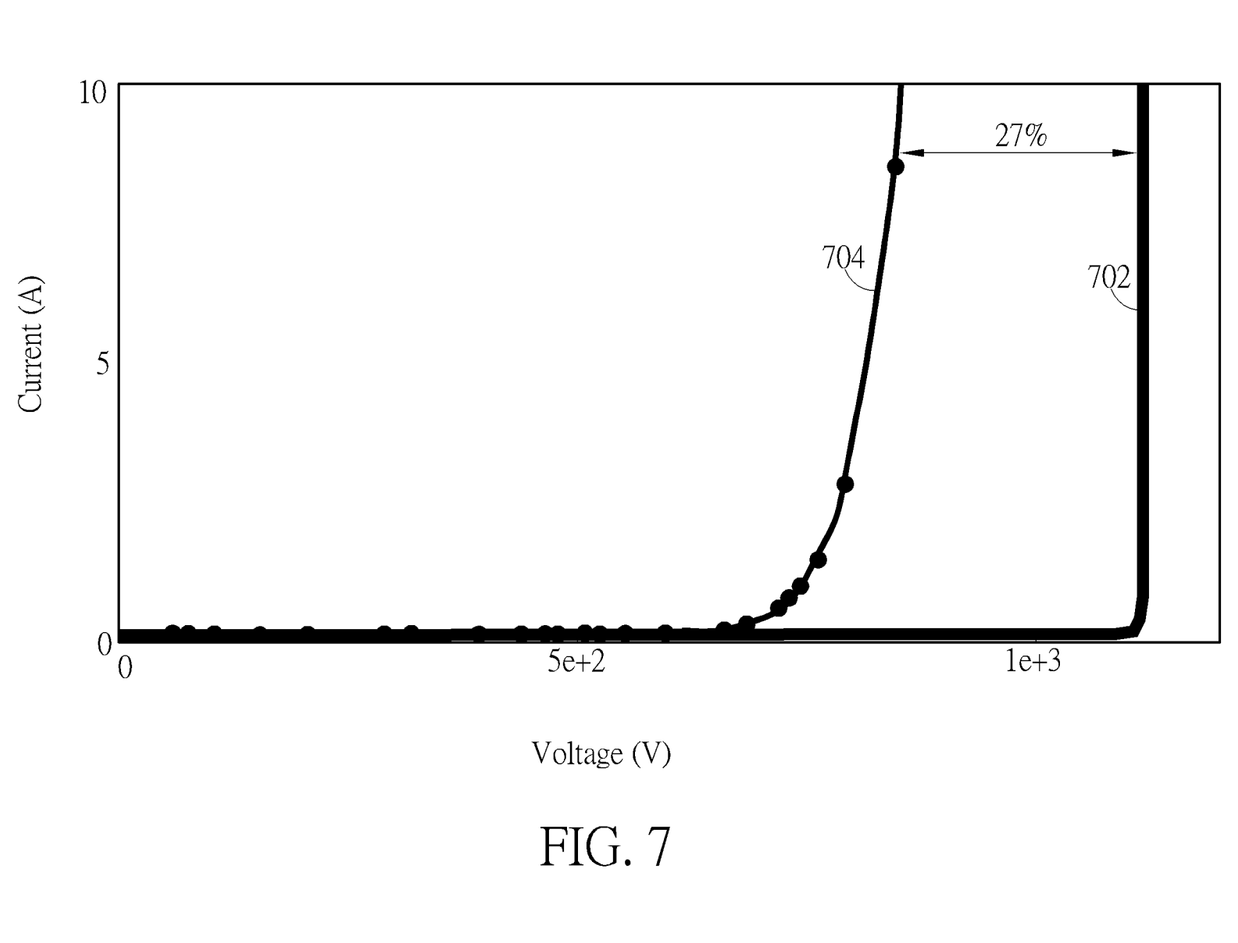
FIG. 7 is a voltage-current diagram of a semiconductor device during reverse bias operation according to an embodiment of the present invention.

The voltage-current diagram shown in FIG. 7 uses the same test object as that used in FIG. 6. Referring to FIG. 7, curve 702 is a voltage-current curve of the embodiment illustrated in FIG. 1 and FIG. 2, and curve 704 is a voltage-current curve of the conventional Schottky diode element. FIG. 7 shows that the breakdown voltage of the embodiment of the present invention under reverse bias is about 27% higher than the breakdown voltage of the conventional Schottky semiconductor element.

Figure 8:
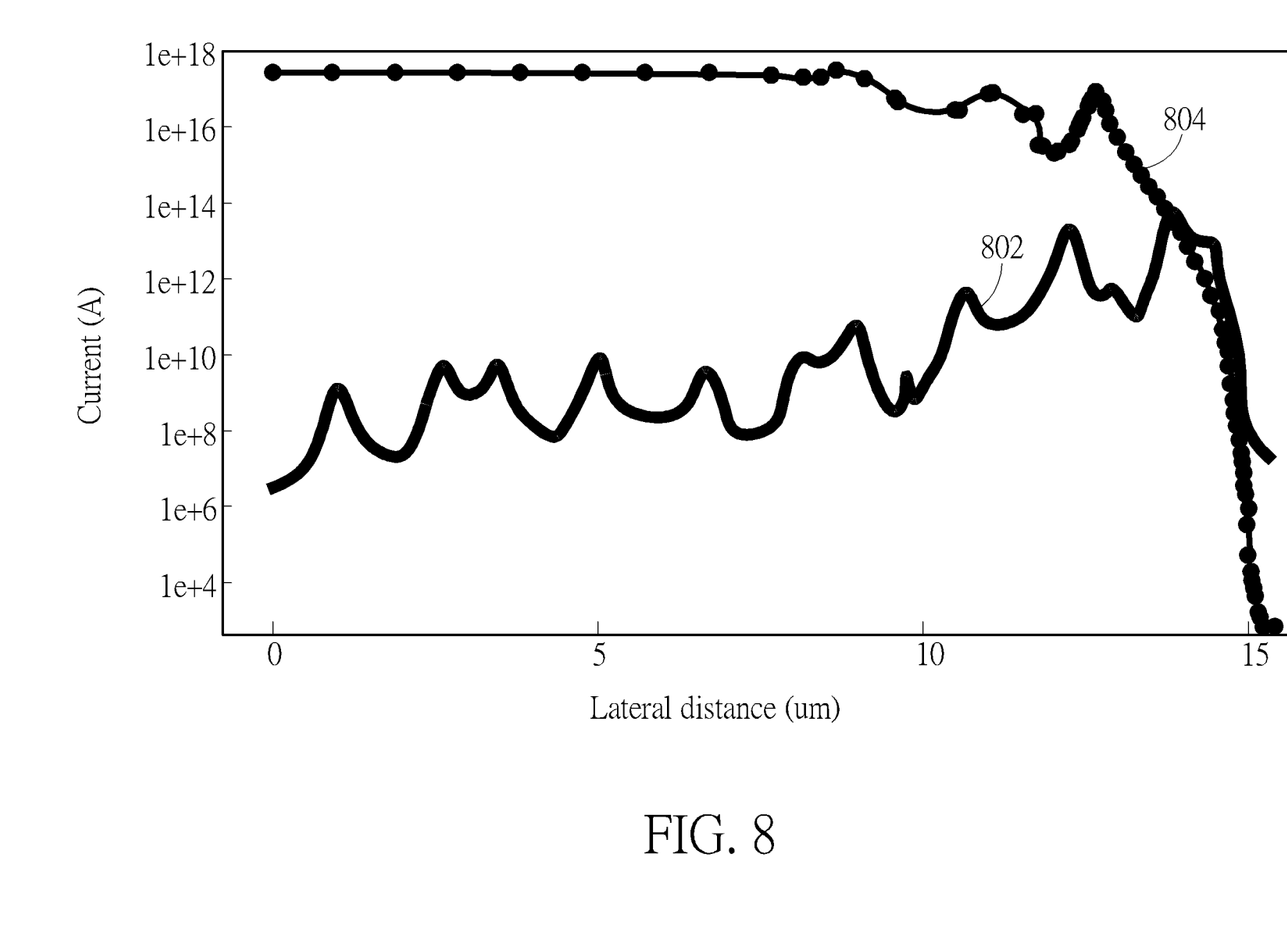
FIG. 8 is a diagram of current distribution of the semiconductor device of the first embodiment during forward bias operation.

The diagram of current distribution shown in FIG. 8 uses the same test object as that used in FIG. 6. Referring to FIG. 8, curve 802 is a current curve of the embodiment illustrated in FIG. 1 and FIG. 2, and curve 804 is a current curve of the conventional Schottky diode element. The location with a lateral distance of 0 is close to the center of the semiconductor device, while the location with a lateral distance of 15 is close to the periphery of the semiconductor device (such as the protective structure). FIG. 8 shows that the embodiment of the present invention has a gentle current distribution under forward bias, which may effectively reduce the surge current and avoid the impact ionization caused by the surge current, thereby improving the reliability of the element.

In order to enable those with ordinary skill in the art to practice the disclosed semiconductor device, the manufacturing method of the semiconductor device of the present invention is further described below.

Figure 9:
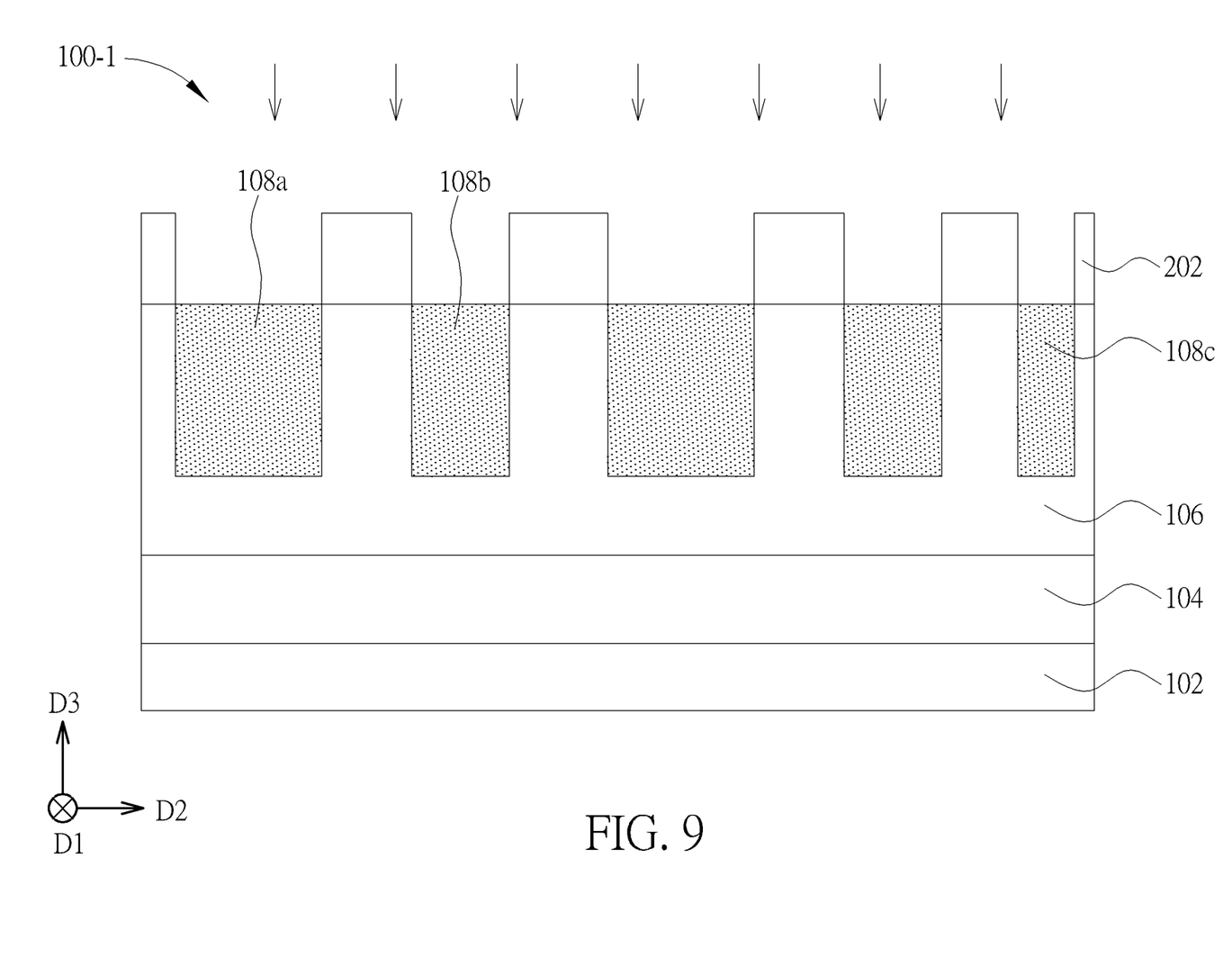
FIG. 9 is a schematic diagram illustrating a cross-sectional view of a semiconductor device of one embodiment in step 100-1.

FIG. 9 is a cross-sectional view of a semiconductor device of an embodiment of the present invention in step 100-1. As shown in the cross-sectional view of FIG. 9, a conductive layer 102 is provided, on which a semiconductor substrate 104 and an epitaxial layer 106 are sequentially disposed, and a first mask 202 is disposed on the surface of the epitaxial layer 106, where a thin film may be formed on the epitaxial layer through a thermal oxidation process and an subsequent etching process. In addition, the first mask 202 may also be a patterned photoresist, but not limited thereto. Afterwards, an ion implantation process is performed on the epitaxial layer 106 which is not covered with the first mask 202 to thereby form first doped regions 108a, second doped regions 108b and a third doped region 108c.

Figure 10:
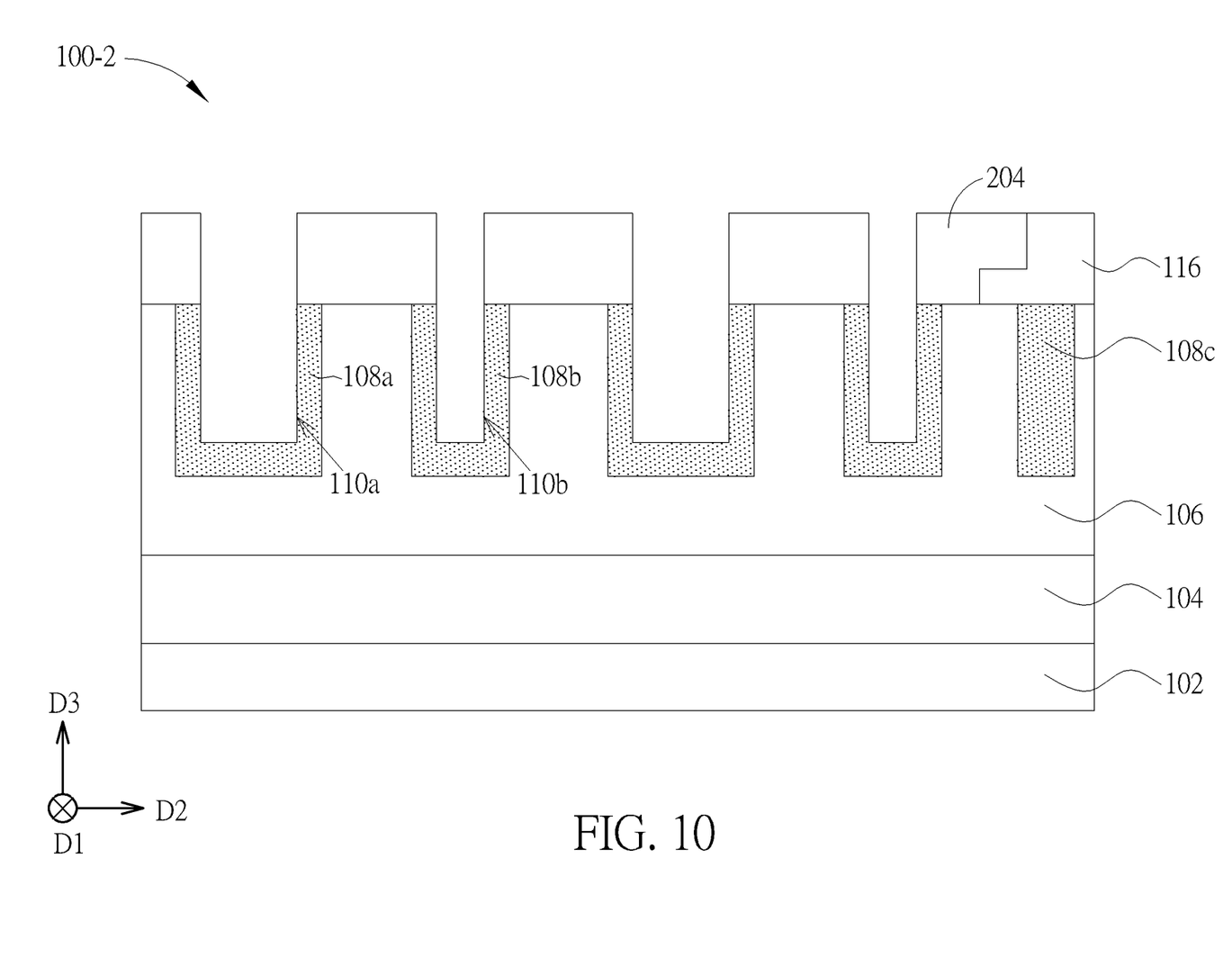
FIG. 10 is a schematic diagram illustrating a cross-sectional view of a semiconductor device of one embodiment in step 100-2.

FIG. 10 is a cross-sectional view of a semiconductor device of an embodiment of the present invention in step 100-2. As shown in the cross sectional view of FIG. 10, the first mask 202 in FIG. 9 is removed, and then a dielectric layer 116 and a second mask 204 are formed on the epitaxial layer 106. Similarly, the second mask 204 may be a thermal oxide film or a photoresist, but not limited thereto. Afterwards, an etching process, such as reactive-ion etching, is performed to thereby form first trenches 110a in the first doped regions 108a and second trenches 110b in the second doped regions 108b.

In the subsequent processes, suitable semiconductor processes may be performed, for example, the second mask 204 may be further removed, and a metal material may be filled into the first trenches 110a and the second trenches 110b to simultaneously form first metal structures, second metal structures and a Schottky layer, so as to obtain the semiconductor device shown in FIG. 2.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a semiconductor substrate;
   an epitaxial layer disposed on the semiconductor substrate, wherein the epitaxial layer is of a first conductivity type;
   a plurality of first metal structures disposed in the epitaxial layer, wherein the first metal structures extend parallelly to each other along a first direction, and each of the first metal structures has a first width in a second direction;
   a plurality of first doped regions disposed in the epitaxial layer and being of a second conductivity type, wherein the second conductivity type is different from the first conductivity type, and each of the first doped regions extends from below each of the first metal structures to a sidewall of each of the first metal structures;
   a plurality of second metal structures disposed in the epitaxial layer, wherein the second metal structures extend parallelly to each other along the first direction, and each of the second metal structures has a second width in the second direction, wherein the first width is greater than the second width;
   a plurality of second doped regions disposed in the epitaxial layer and being of the second conductivity type, wherein each of the second doped regions extends from below each of the second metal structures to a sidewall of each of the second metal structures;
   a conductive layer disposed under the semiconductor substrate; and
   a Schottky layer disposed on the epitaxial layer;
   wherein the first metal structure is between two adjacent second metal structures, and the second metal structure is between two adjacent first metal structures.

2. The semiconductor device of claim 1, wherein the first metal structure and the second metal structure adjacent to each other are separated by the epitaxial layer.

3. The semiconductor device of claim 1, wherein each of the first doped regions comprises a first sidewall and a second sidewall oppositely arranged to each other, each of the second doped regions comprises a first sidewall and a second sidewall oppositely arranged to each other, a first spacing exists between the second sidewall of each of the first doped regions and the first sidewall of adjacent second doped region, and a second spacing exists between the first sidewall of each of the first doped regions and the second sidewall of adjacent second doped region;
   wherein the first spacing is the same as the second spacing.

4. The semiconductor device of claim 3, wherein the first spacing and the second spacing are both equal to the first width, and the first spacing and the second spacing are both greater than the second width.

5. The semiconductor device of claim 3, wherein the first spacing and the second spacing are both less than the first width, and the first spacing and the second spacing are both greater than the second width.

6. The semiconductor device of claim 1, wherein the first metal structures and the second metal structures have the same depth in a third direction, and the third direction is perpendicular to the first direction and the second direction.

7. The semiconductor device of claim 1, wherein a depth of the first metal structures in a third direction is less than a depth of the second metal structures in the third direction, and the third direction is perpendicular to the first direction and the second direction.

8. The semiconductor device of claim 1, wherein the first doped regions and the second doped regions have the same depth in a third direction.

9. The semiconductor device of claim 7, wherein the depth of the first doped regions in the third direction is less than the depth of the second doped regions in the third direction.

10. The semiconductor device of claim 1, wherein the first metal structures, the second metal structures, and the Schottky layer have the same composition.

11. The semiconductor device of claim 1, wherein the first metal structures and the second metal structures have the same composition, and the Schottky layer have a composition different from compositions of the first metal structures and the second metal structures.

12. The semiconductor device of claim 3, wherein a first sidewall thickness of each of the first doped regions is equal to a second sidewall thickness of each of the first doped regions, and a first sidewall thickness of each of the second doped regions is equal to a second sidewall thickness of each of the second doped regions.

13. The semiconductor device of claim 12, wherein the first sidewall thickness of the first doped regions is greater than the first sidewall thickness of the second doped regions.

14. The semiconductor device of claim 12, wherein each of the first doped regions has a first bottom thickness, and each of the second doped regions has a second bottom thickness;
   wherein the first bottom thickness is equal to the second bottom thickness;
   wherein the first sidewall thickness of each first doped region is equal to the first bottom thickness of each first doped region, and the first sidewall thickness of each second doped region is equal to the second bottom thickness of each second doped region.

15. The semiconductor device of claim 12, wherein each of the first doped regions has a first bottom thickness, and each of the second doped regions has a second bottom thickness;
   wherein the first bottom thickness is different from the second bottom thickness;
   wherein the first sidewall thickness of each first doped region is different from the first bottom thickness of each first doped region, and the first sidewall thickness of each second doped region is different from the second bottom thickness of each second doped region.

16. The semiconductor device of claim 1, wherein the first doped regions and the second doped regions have the same dopant concentration.

17. The semiconductor device of claim 1, wherein the first doped regions and the second doped regions have different dopant concentrations.

18. The semiconductor device of claim 1, further comprising:
   at least one protective structure surrounding the first doped regions and the second doped regions.

19. The semiconductor device of claim 1, wherein the first metal structures, the second metal structures, and the Schottky layer have the same work function.

20. The semiconductor device of claim 1, wherein the first metal structures and the second metal structures have the same work function, and the Schottky layer has a work function different from the work functions of the first metal structures and the second metal structures.

* * * * *